United States Patent
An et al.

(10) Patent No.: US 6,396,294 B2
(45) Date of Patent: *May 28, 2002

(54) SOCKET PIN AND SOCKET FOR ELECTRICAL TESTING OF SEMICONDUCTOR PACKAGES

(75) Inventors: Young-soo An; Young-moon Lee; Jae-il Lee; Hyo-geun Chae, all of Chungcheongnam-do (KR)

(73) Assignee: Samsung Electronics Co., Ltd., Kyungki-do (KR)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/430,997

(22) Filed: Nov. 1, 1999

(30) Foreign Application Priority Data

Apr. 28, 1999 (KR) .............................. 99-15206

(51) Int. Cl.$^7$ ................................. G01R 1/04
(52) U.S. Cl. .................. 324/761; 324/754; 324/72.5; 324/158.1; 439/482; 439/700
(58) Field of Search ................ 324/761, 158.1, 324/754, 72.5, 73.1; 439/482, 700

(56) References Cited

U.S. PATENT DOCUMENTS 4,012,094 A * 3/1977 VanRenssen et al. ......... 339/17
4,887,969 A * 12/1989 Abe .............................. 439/73
5,218,292 A * 6/1993 Goto ........................ 324/158.1
5,504,435 A * 4/1996 Perego ........................ 324/755
5,952,843 A * 9/1999 Vinh .......................... 324/761

FOREIGN PATENT DOCUMENTS

JP       5055415       3/1993

OTHER PUBLICATIONS

Patent Abstract of Japan JP5055415 Supplied from the esp@cenet Database, May. 1993.

* cited by examiner

Primary Examiner—Michael J. Sherry
Assistant Examiner—Jimmy Nguyen
(74) Attorney, Agent, or Firm—Skjerven Morrill MacPherson LLP; David W. Heid

(57) ABSTRACT

A socket pin and a socket for electrical testing of a semiconductor package suppress electrical open/short defects due to contact failure and reduce manufacturing costs. The socket pin includes: an upper portion that connects to a lead of the semiconductor package, for exchanging a signal between the semiconductor package and a tester; a body connected to the upper portion, for buffering at two points, a downward force applied by the lead of the semiconductor package to the upper portion; a lower portion connected to the body of the socket pin, the lower portion being elastically durable to the force from the upper portion and the body; and a lower socket pin connected to the lower portion, which acts as a path for transmitting or receiving an electrical signal.

19 Claims, 4 Drawing Sheets

SOCKET PIN AND SOCKET FOR ELECTRICAL TESTING OF SEMICONDUCTOR PACKAGES

BACKGROUND OF THE INVENTION

1. Field of the Invention

The present invention relates to electrical testing of semiconductor packages, and more particularly, to a socket pin and a socket for an electrical testing process.

2. Description of the Related Art

In general, effective electrical testing of a semiconductor package requires good contact between a test board and leads of the package. To achieve the required contacts, a test socket holds a semiconductor package for electrical testing.

The test socket commonly includes multiple socket pins on a socket board in a performance board of a tester. Each socket pin connects a lead of a semiconductor package to the tester for bi-directional passage of an electrical signal. A poor electrical contact or a contact failure, which may occur in the test socket, inhibits the transfer of electrical signals between the semiconductor package and the tester, so that a good chip may be evaluated as defective. Accordingly, a test socket providing a poor contact lowers the reliability of the electrical testing.

One of the major reasons for poor electrical contact is the wiping phenomenon. The wiping phenomenon refers to the mechanical and/or electrical deterioration of a socket pin, which arise from the wearing of a socket pin when inserting or removing a lead of a semiconductor package from contact with the socket pin.

FIG. 1 is a sectional view showing how a lead 59 of a semiconductor package 57 contacts a conventional C-type socket pin 53 of a test socket. Referring to FIG. 1, the left side of FIG. 1 shows the semiconductor package 57 when first seated on the C-type socket pin 53 of a socket board 55. To establish a good electrical contact, a pusher 51 applies a downward force to lead 59. The downward force compresses socket pin 53. The right side of FIG. 1 shows the socket pin 53 after the downward force on lead 59 of semiconductor package 57 compresses the socket pin 53.

When the pusher 51 applies the downwards (i.e., in a Y-axis direction) contact force to the lead 59 of the semiconductor package 57, a portion A of the socket pin 53 elastically bends or flexes. The movement of portion A of pin 53 in a direction A' causes friction and thereby causes the wiping phenomenon. As a result, a contact force Fc between the lead 59 and the socket pin 53 acts in a diagonal direction indicated on the right side of FIG. 1.

The contact force Fc acting in the diagonal direction causes tin (Sn) coated on the surface of the lead 59 of the semiconductor package 57 to stick to the surface of the socket pin 53. As the electrical test is repeated for several packages, the size of a tin flake stuck to the surface of the socket pin 53 increases. This flake can cause an electrical short with another neighboring socket pin (not shown). Also, the tin flake may stick to the lead of the semiconductor package 57, causing a visual defect on the lead 59 of the semiconductor package 57.

FIG. 2 is a sectional view showing how a lead 79 of a semiconductor package 77 contacts a conventional POGO-type socket pin 73 of a test socket on a socket board 75.

Referring to FIG. 2, the left side of FIG. 2 shows seating of the lead 79 of the semiconductor package 77 on the POGO-type socket pin 73. A pusher 71 applies a force in the Y-axis direction (downward), and FIG. 2 shows how the downward stroke of the pusher 71 compresses a spring 74 in the POGO pin 73.

In FIG. 2, a contact force Fc acts only in the Y-axis direction, without causing friction. As the result, the wiping phenomenon, short failures, and visual defects that tin flakes cause when using the conventional C-type socket pin, do not occur when using the POGO pin 73. However, the POGO pin has no self cleaning mechanism capable of removing materials that oxidation or contamination can leave at the pin surface in contact with the lead 79 of the semiconductor package 77. Thus, when the surface of the POGO pin is oxidized or contaminated, an open failure can occur during an electrical test, resulting in mis-evaluation of a good chip as a defective chip. As a result, the reliability of the electrical test is lower, and mis-evaluation of chips results in lower yields and additional manufacturing costs.

SUMMARY OF THE INVENTION

In accordance with an aspect of the present invention, a socket pin for electrical testing of semiconductor packages has a shortened wiping distance. The shorter wiping distance suppresses open/short defects of the socket pins resulting from the wiping phenomenon, and thereby improves chip yield and accuracy in the testing and reduces visual defects and manufacturing costs.

In accordance with one embodiment of the present invention, a socket pin in a socket for electrical testing of semiconductor packages includes: an upper portion; a body connected to the upper portion; a lower portion connected to the body; and a lower socket pin connected to the lower portion of the socket pin. The upper portion is for connection to a lead of a semiconductor package. The body buffers a downwards force that the lead of the semiconductor package applies to the upper portion of the socket pin, and in response to the downward force, the body flexes at two points.

The lower portion is elastically durable to the force from the upper portion and the body of the socket pin, and the lower socket pin acts as a path for transmitting or receiving an electrical signal.

Preferably, the body of the socket pin has a curved shape so as to absorb well the impact generated from pressing on the lead of the semiconductor package, and more preferably, the curved shape is an S-type curve.

The socket pin can be manufactured by stamping using a press machine and plating a substrate of an alloy of beryllium A (Be) and copper (Cu), with nickel (Ni) and gold (Au) in sequence.

In accordance with another embodiment of the present invention, a socket for electrical testing of a semiconductor package, includes a plurality of socket pins, each having a structure including an upper portion, a body, a lower portion, and a lower socket pin. The structure of each socket pin is capable of dispersing and buffering a contact force from a lead of the semiconductor package and flexes at a minimum of two points. The socket further includes a main body as a molded frame, into which the lower socket pins of the socket pins are inserted and fixed, and in which the lower portions of the socket pins are fitted. The main body allows a space around each socket pin such that the body and the upper portion of the socket pin can move within a predetermined range.

Preferably, the main body of the socket is nonconductive, and prevents electrical shorts between adjacent socket pins.

Preferably, the main body of the socket has a structure that limits the wiping distance of the upper portion of the socket pin. The wiping occurs when the body of the socket pin absorbs a primarily impact.

According to an aspect of the present invention, during electrical testing of a semiconductor package, open/short defects due to the defects of a socket pin, are reduced, increasing the yield of the packages passing the electrical testing and improving accuracy in the electrical testing. Also, the visual defects on the leads of semiconductor packages, due to tin flakes stuck on the leads, are reduced or prevented.

BRIEF DESCRIPTION OF THE DRAWINGS

The aspects and advantages of the present invention will become more apparent by describing embodiments of the invention with reference to the attached drawings in which.

DESCRIPTION OF THE PREFERRED EMBODIMENTS

Figure 1:
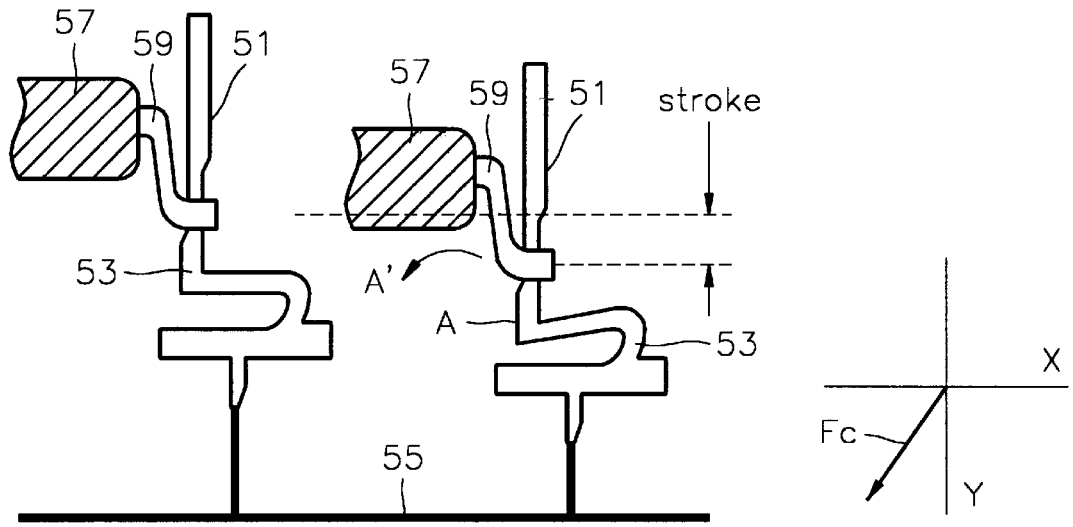
FIGS. 1 and 2 are sectional views of conventional socket pins used for electrical testing of semiconductor packages.
Figure 2:
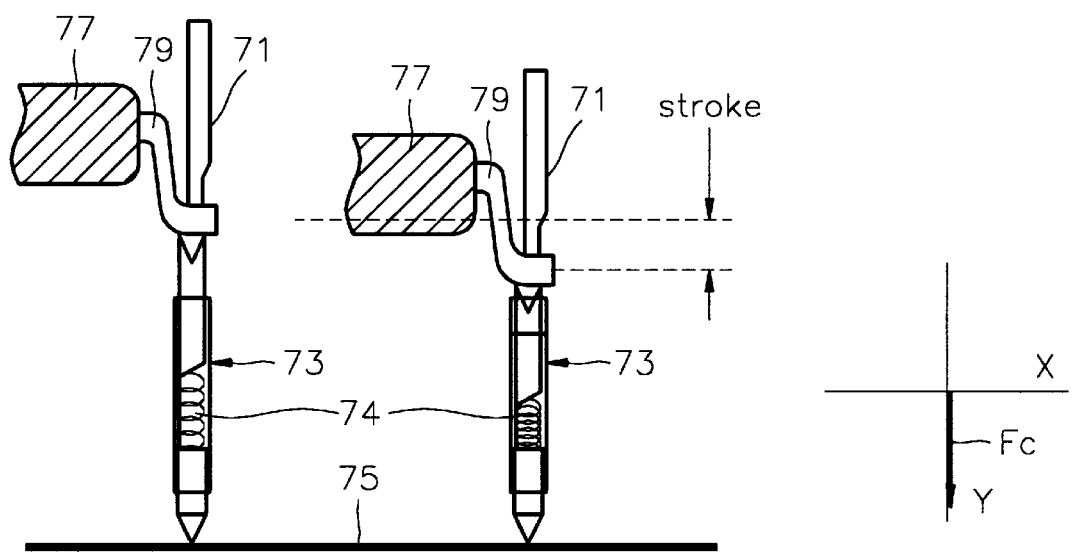

In the following embodiments, the term semiconductor package is used in a broad sense, and is not limited to a specific semiconductor package type such as an SOP (Small Out-line line Package) illustrated in the drawings. The present invention can be applied to other packages, for example, a QFP (Quad Flat Package) or a PLCC (Plastic Leaded Chip Carrier). Further, the following embodiments are merely illustrative, and the present invention is not limited to those embodiments.

Figure 3:
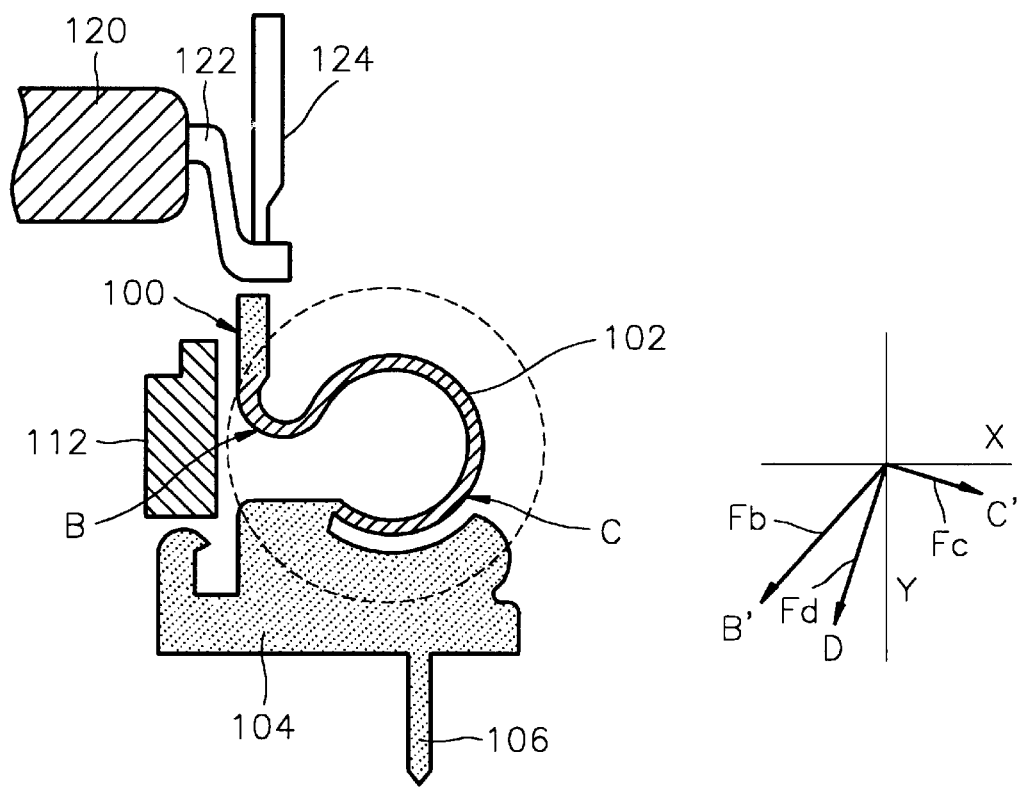
FIG. 3 is a sectional view of a socket pin used for electrical testing according to an embodiment of the present invention.

FIG. 3 is a sectional view illustrating a socket pin used in electrical testing of a semiconductor package 120, according to an embodiment of the present invention. Referring to FIG. 3, a socket pin for electrical testing of a semiconductor package includes an upper portion 100, a body 102, a lower portion 104, and a lower socket pin 106. Upper portion 100 contacts a lead 122 of the semiconductor package 120 during electrical testing of the semiconductor package 120. Body 102 of the socket pin (represented with hatched lines in FIG. 3), which connects to the upper portion 100 of the socket pin, buffers a force applied to the upper portion 100 of the socket pin. In particular, a downward force from the lead 122 of the semiconductor package 120 flexes body 102 at two points B and C. Lower portion 104 of the socket pin, which connects to the body 102 of the socket pin, is elastically durable to a force which the upper portion 100 and the body 102 of the socket pin produce when the lead of the semiconductor package 122 contacts the socket pin. Lower socket pin 106 connects to the lower portion 104 of the socket pin and acts as a path for transfer or receipt of an electrical signal to or from an external test circuit. An interceptor 112 portion of a socket main body is described below.

In the socket pin of FIG. 3, the body 102 has a curved shape, particularly, an S-type shape, capable of absorbing well the force that a pusher 124 applies to the socket via the lead 122. In the conventional C-type socket pin, only one portion A (see FIG. 1) bends elastically when a pusher presses on the lead of the semiconductor package. In contrast, body 102, which has an S-type shape, can symmetrically disperse a contact force applied to the upper portion 100 of the socket pin. In particular, when the pusher 124 presses on the lead 122 of the semiconductor package 120, the body 102 flexes at two points B and C to symmetrically disperse and absorb the contact force. As shown on the right side of FIG. 3, the contact force Fd applied to the upper part 100 of the socket pin is primarily absorbed or opposed by a force Fb having a direction B' at the point B, and secondarily by a force Fc in a direction C' at the point C. Thus, the sum of the two divided forces acts in a direction opposite direction D. When compared to the conventional C-type socket pin (see FIG. 1), the wiping due to lateral frictional force can be markedly reduced. Also, the reduced wiping reduces formation of tin flakes, electrical shorts between adjacent socket pins, and visual defects due to tin flakes stuck to the leads of semiconductor packages. However, the friction and the flexible movement of the body 102 of the S-type socket pin clean the surface of the upper portion 100 of the socket pin and prevent collection of contamination on the upper portion 100 that causes poor electrical contact. Also, in the socket pin of FIG. 3, the body 102 disperses and buffers the contact force on the upper portion 100 of the socket pin and relieves mechanical stress on the lower socket pin 106, extending the life time of the socket pin.

Figure 4:
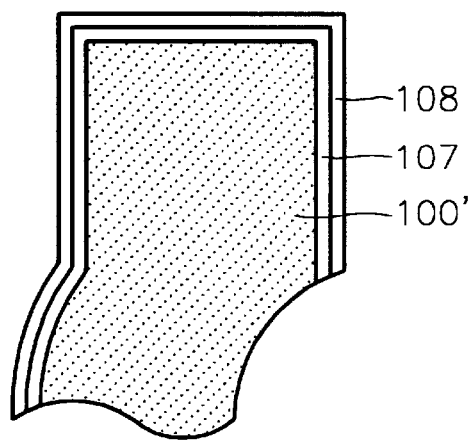
FIG. 4 is an expanded view illustrating the internal structure of a socket pin according to an embodiment of the present invention.

The S-type socket pin according to the embodiment of the present invention illustrated in FIG. 3, can be manufactured through stamping using a press machine, so that the manufacturing cost of the socket pin is low. FIG. 4 is a cross-sectional view illustrating a composition for a socket pin for electrical testing of a semiconductor package. In FIG. 4, a socket pin includes a substrate 100' made of beryllium (Be) and copper (Cu), a nickel (Ni) plating layer 107 formed around the substrate 100', and a gold (Au) plating layer 108 coated surrounding the Ni plating layer 107. The nickel plating layer 107 strengthens the mechanical hardness of the socket pin, and the gold plating layer enhances electrical conductivity and contact of the socket pin.

Figure 5:
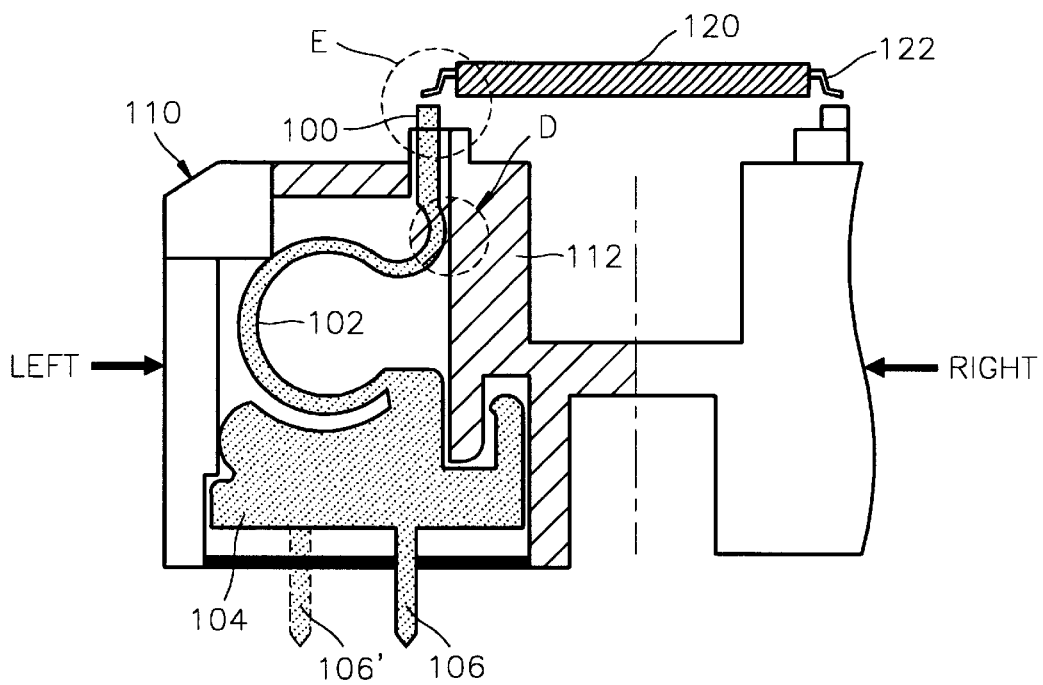
FIG. 5 is a sectional view illustrating the coupling of the socket pin to a main body of a socket according to an embodiment of the present invention.

FIG. 5 is a sectional view illustrating the coupling of a socket pin to the main body of a socket according to an embodiment of the present invention. Referring to FIG. 5, a main body 110 of a socket is essentially a non-conductive molded frame and may be a plastic such as polyetherimide or polyethersulfone. One or more socket pins having the structural characteristics illustrated with reference to FIG. 3 couple to main body 110. When the main body 110 of the socket contains multiple socket pins, socket pins for SOPs can be arranged in two parallel rows, and socket pins for QFPs can be arranged to form rectangles. Also, the main body 110 of the socket should be constituted so that the socket pins do not electrically short to neighboring socket pins. Inserting the lower socket pin 106 into the main body 110 of the socket fixes the socket pin in place, with the lower portion 104 of the socket pin secured in the molded frame of the main body 110. A space in the main body 110 allows the body 102 and the upper portion 100 of the socket pin to flexibly move in response to the externally applied contact force. In FIG. 5, the socket is symmetrical with respect to a central line indicated by a dot-and-dashed line, thus illustration of the right portion of the socket is omitted.

In FIG. 5, reference character D represents a contact portion between the body 102 of the socket pin and an interceptor 112 of the socket main body 110, and reference character E represents a contact portion between the upper portion 100 of the socket pin and the lead 122 of the semiconductor package 120. The interceptor 112 is important in limiting the wiping distance of the socket pin in the lateral direction. When the lead of the semiconductor package 122 contacts the upper portion 100 of the socket pin and applies a contact force to the body 102 via the upper portion 100, the contact force flexes the body 102 and moves a portion of the body 102 laterally into contact with interceptor 112. At this time, the interceptor 112 forcibly limits the lateral movement of the body 102 of the socket pin, thereby reducing the wiping distance of the upper portion 100 of the socket pin.

Figure 6:
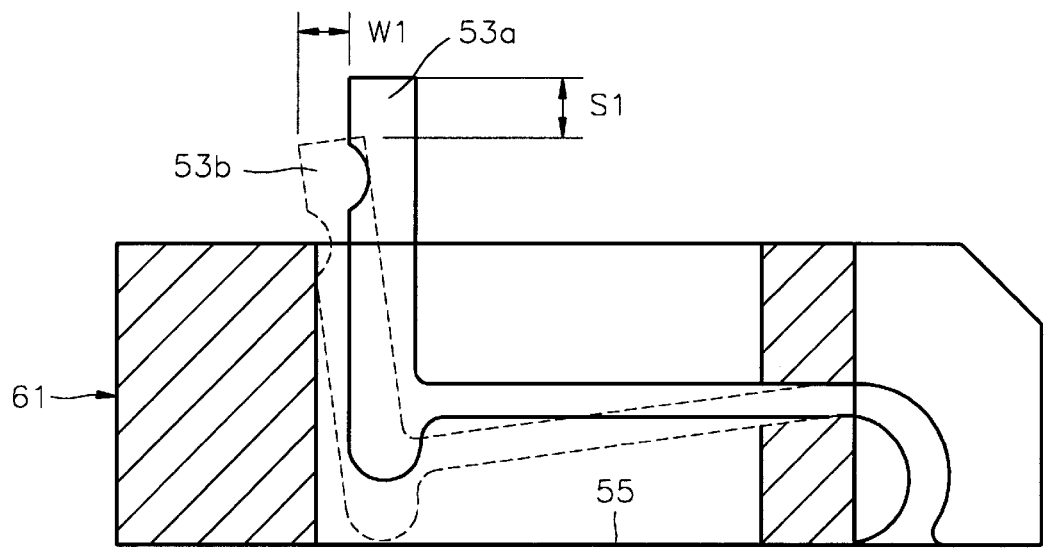
FIGS. 6 and 7 are sectional views comparatively illustrating the effect of pin compression respectively in a C-type socket pin and a pin socket in accordance with an embodiment of the invention.
Figure 7:
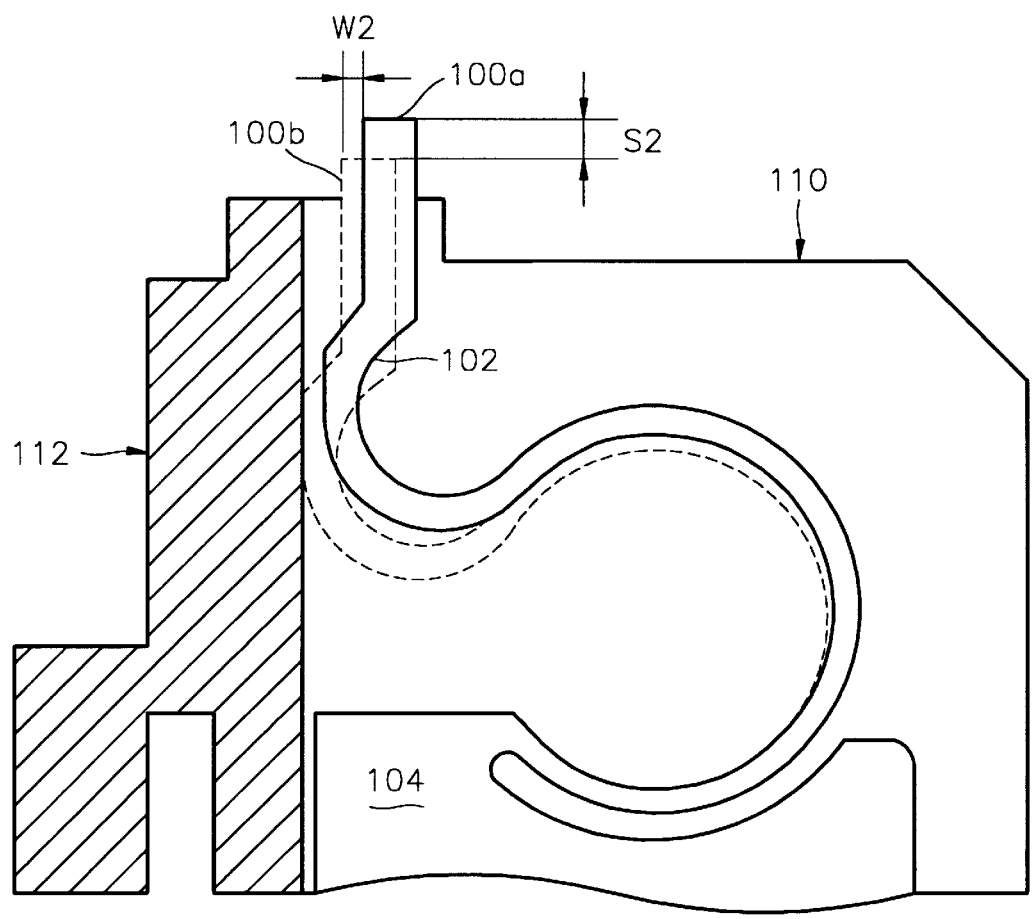

FIGS. 6 and 7 are sectional views comparatively illustrating the effect of interceptor 112 in a socket pin in accordance with an embodiment of the present invention to the effect of a main body 61 used with a conventional socket pin on a socket board 55. In particular, FIG. 6 shows a wiping distance W1 and a stroke distance S1 of a conventional C-type socket pin when a contact force compresses the socket pin. Reference character 53a represents the socket pin in an initial position where the socket pin is not compressed, and reference character 53b represents the position of the socket pin when compressed. The wiping distance W1 and the stroke distance S1 were measured on 10 sample socket pins of the type illustrated in FIG. 6. As a result, the average of the a measured wiping distances W1 was 0.502 mm, and the minimum and maximum values thereof were 0.289 mm and 0.524 mm, respectively. Also, the average of the stroke distances S1 was 0.79 mm.

FIG. 7 shows a wiping distance W2 and a stroke distance S2 of the S-type socket pin according to an embodiment of the present invention when the force applied to the conventional C-type socket pin, illustrated in FIG. 6, is applied to the S-type socket pin. The average of the wiping distances W2 on 10 sample socket pins was 0.226 mm, and the minimum and maximum values thereof were 0.187 mm and 0.257 mm, respectively. Also, the average of the socket distances S2 was 0.54 mm. The results indicate a great improvement in the wiping distance and the stroke distance. The reduction of lateral movement and a reduction in tilting of the upper portion of the socket pin mean that the contact between the lead of the semiconductor package and the socket pin is more stable than in the contact of a conventional socket pin.

As described above, according to the present invention, the structure of a socket pin in a socket used for electrical testing of a semiconductor package is improved such that a lateral wiping distance is smaller when the semiconductor lead contacts the socket pin. The shorter lateral wiping distance reduces open/short defects, which may occur during the electrical testing due to a defect of the socket pin, reduces visual defects due to a tin flake stuck to the lead of the semiconductor package, and extends the life time of the socket pin. Still, the remaining wiping cleans the socket pin to improve electrical contact with the leads of a semiconductor package.

While this invention has been particularly shown and described with reference to preferred embodiments thereof, it to will be understood by those skilled in the art that various changes in form and details may be made therein without departing from the spirit and scope of the invention as defined by the following claims.

What is claimed is:

1. A socket pin comprising:
   an upper portion to be connected to a lead of a semiconductor package, for exchanging a signal between the semiconductor package and a tester;
   a body connected at a first end to the upper portion, the body having at least an S-shaped portion to disperse a downward force applied to the upper portion of the socket pin;
   a lower portion connected to a second end of the body of the socket pin; and
   a lower socket pin connected to the lower portion of the socket pin, the lower socket pin acting as a path for an electrical signal.

2. The socket pin of claim 1, wherein the socket pin is manufactured by stamping using a press machine.

3. The socket pin of claim 1, wherein the socket pin comprises:
   a substrate of an alloy of beryllium (Be) and copper (Cu);
   a layer of nickel (Ni) on the substrate; and
   a layer of gold (Au) on the layer of nickel.

4. A socket for electrical testing of a semiconductor package, comprising:
   a plurality of socket pins, each socket pin having a structure including an upper portion, a body having at least an S-shaped portion, a lower portion, and a lower socket pin, the structure being capable of dispersing and buffering a contact force from a lead of the semiconductor package; and
   a main body into which the lower socket pins of the plurality of socket pins are inserted, wherein for each socket pin, the main body allows a space such that the body and the upper portion of the socket pin can move within a predetermined range.

5. The socket of claim 4, wherein the main body of the socket is non-conductive.

6. The socket of claim 4, wherein the main body limits a wiping distance of the upper portion of each socket pin, that occurs when the body absorbs a primary impact of a lead on the socket pin.

7. The socket of claim 4, wherein the main body of the socket prevents each socket pin from electrically shorting to a neighboring socket pin.

8. The socket of claim 4, wherein the body of each of the socket pins has a curved shape having at least two arched portions.

9. The socket of claim 4, wherein the main body includes a plurality of interceptors, each interceptor for restricting lateral movement of the body of a corresponding socket pin.

10. A socket pin comprising:
    an upper portion to be connected to a lead of a semiconductor package, for exchanging a signal between the semiconductor package and a tester;
    a body connected to the upper portion;
    a lower portion connected to the body of the socket pin, the lower portion having a recess formed in a top surface thereof; and
    a lower socket pin connected to the lower portion of the socket pin, the lower socket pin acting as a path for an electrical signal,
    wherein a portion of the body extends into the recess formed in the top surface of the lower portion.

11. The socket pin of claim 10, wherein the portion of the body that extends into the recess formed in the top surface of the lower portion has a curved shape.

12. The socket pin of claim 10, wherein the body of the socket pin has a curved shape having at least two arched portions.

13. The socket pin of claim 10, wherein the body includes an S-shape portion.

14. A socket pin comprising:

an upper portion to be connected to a lead of a semiconductor package, for exchanging a signal between the semiconductor package and a tester;

a body connected at a first end to the upper portion, the body having at least an S-shaped portion to disperse a downward force applied to the upper portion of the socket pin;

a lower portion connected to a second end of the body of the socket pin; and a lower socket pin connected to the lower portion of the socket pin, the lower socket pin acting as a path for an electrical signal;

wherein the S-shaped portion of the body includes a first arched portion adjacent to the upper portion of the socket pin and a second arched portion adjacent to the lower portion of the socket pin arranged such that the downward force is opposed by a force generated by the first arched portion and by a force generated by the second arched portion.

15. The socket pin of claim 14, wherein the socket pin is manufactured by stamping using a press machine.

16. The socket pin of claim 14, wherein the socket pin comprises:

a substrate of an alloy of beryllium (Be) and copper (Cu);

a layer of nickel (Ni) on the substrate; and a layer of gold (Au) on the layer of nickel.

17. A socket for electrical testing of a semiconductor package, comprising:

a plurality of socket pins, each socket pin having a structure including an upper portion, a body having at least an S-shaped portion, a lower portion, and a lower socket pin, the structure being capable of dispersing and buffering a contact force from a lead of the semiconductor package, wherein the S-shaped portion of each socket pin includes a first arched portion adjacent to the upper portion of the socket pin and a second arched portion adjacent to the lower portion of the socket pin arranged such that the contact force is opposed by a force generated by the first arched portion and by a force generated by the second arched portion; and a main body into which the lower socket pins of the plurality of socket pins are inserted, wherein for each socket pin, the main body allows a space such that the body and the upper portion of the socket pin can move within a predetermined range.

18. The socket of claim 17, wherein the main body limits a wiping distance of the upper portion of each socket pin, that occurs when the body absorbs a primary impact of a lead on the socket pin.

19. The socket of claim 17, wherein the main body of the socket prevents each socket pin from electrically shorting to a neighboring socket pin.

* * * * *